(12) United States Patent
Ooi et al.

(10) Patent No.: US 8,803,612 B1
(45) Date of Patent: Aug. 12, 2014

(54) LOW-NOISE AMPLIFIER WITH HIGH LINEARITY

(75) Inventors: Ben Zee Min Ooi, Selangor (MY); Chee Ling Wong, Kuala Lumpur (MY); Cheng Wei Hoh, Pahang (MY)

(73) Assignee: Scientific Components Corporation, Brooklyn, NY (US)

( * ) Notice: Subject to any disclaimer, the term of this patent is extended or adjusted under 35 U.S.C. 154(b) by 76 days.

(21) Appl. No.: 13/559,135

(22) Filed: Jul. 26, 2012

(51) Int. Cl.
*H03F 3/04* (2006.01)

(52) U.S. Cl.
USPC .......................................... 330/296; 330/288

(58) Field of Classification Search
USPC ............ 330/288, 310, 98, 133, 150, 285, 296
See application file for complete search history.

(56) References Cited

U.S. PATENT DOCUMENTS

| | | | |
|---|---|---|---|
| 5,235,289 A | 8/1993 | Kunitomo | |
| 5,592,122 A | 1/1997 | Masahiro et al. | |
| 6,023,197 A | 2/2000 | Ter Laak | |
| 6,166,599 A | 12/2000 | Aparin et al. | |
| 6,407,640 B1 | 6/2002 | Aparin et al. | |
| 6,437,646 B2 | 8/2002 | Masahiro | |
| 6,531,924 B2 | 3/2003 | Aparin | |
| 6,556,084 B2 | 4/2003 | Sowlati | |
| 6,670,865 B2* | 12/2003 | Lopez | ............................. 333/33 |
| 6,717,463 B2 | 4/2004 | Aparin | |
| 7,714,659 B2* | 5/2010 | Leitner | ......................... 330/296 |
| 7,853,235 B2 | 12/2010 | Aparin | |

* cited by examiner

*Primary Examiner* — Hieu Nguyen
(74) *Attorney, Agent, or Firm* — Lawrence G. Fridman

(57) ABSTRACT

A low-noise amplifier with high linearity has two common source FET amplifying stages, where the amplifier performance is linearized by use of a second stage active biasing circuit including a current mirror with a feedback network. The linearity improvement technique is employed on a 0.5-2 GHz flat gain amplifier. The improvement causes nodegradation to other RF parameters and allows for the amplifier circuit to be realized in a gallium arsenide microwave monolithic integrated circuit.

12 Claims, 6 Drawing Sheets

LOW-NOISE AMPLIFIER WITH HIGH LINEARITY

BACKGROUND OF THE INVENTION

1. Field of the Invention

The present invention relates generally to a linearity improvement for a Field Effect Transistor (FET) amplifier and more specifically to two stage FET amplifiers using a feedback network in a second stage active bias circuit to achieve improved linearity at radio frequencies.

2. Description of the Prior Art

Many FET amplifier topologies have inherent nonlinearity which must be corrected in order to achieve optimal performance. Improved linearization allows an amplifier to operate at comparable output power with reduced intermodulation and reduced DC power consumption. FET gate biasing techniques to improve linearity are well known in the art but generally are very sensitive to small bias variations, yield only a modest improvement at radio frequencies, or increase the circuit's noise factor.

U.S. Pat. No. 7,853,235 entitled FIELD EFFECT TRANSISTOR WITH LINEARIZATION teaches a source degeneration inductance and at least two field effect transistors coupled in parallel and having mutually different gate biasing. Source connections of the field effect transistors are coupled along different positions of the source degeneration inductance. Several inductors are required for realization of this circuit, and one of the inductors must be a tapped inductor. One disadvantage of requiring inductors is the size of the resulting circuit, which is particularly critical when the device is intended to be realized as an integrated circuit.

U.S. Pat. No. 6,717,463 entitled CIRCUITS FOR LINEARIZING ELECTRONIC CIRCUITS teaches a linearized amplifier circuit having a single bipolar transistor and a first series LC network connected between the common terminal of the transistor and ground, and a second series LC network connected between the input terminal of the transistor and ground. The linearization circuit does not interfere with the transistor amplification of an input RF signal. In the presence of two input signals or an input modulated carrier, the linearization circuit forces the control voltage between the input terminal and the common terminal of the transistor to be zero at the difference frequency of the two input signals or at a modulation frequency of the input modulated carrier. However, the use of the tuned LC network terminates the difference frequency at a specific frequency and thus it is not a wideband linearization solution. In addition, this method is only applicable to bipolar transistors where the difference frequency is present at the base of the transistor. For FETs, this linearization technique is not possible. The use of the LC network connected between the emitter of the main transistor and emitter of the current mirror instead of grounding these terminals may introduce unwanted feedback and thus this linearization method must be designed very carefully to avoid unwanted oscillation.

U.S. Pat. No. 6,531,924 entitled BIAS METHOD AND CIRCUIT FOR DISTORTION REDUCTION teaches a biasing circuit generating a direct current (DC) signal proportional to a selected nonlinearity, using the DC signal to generate the bias voltage of the transistor at which the selected nonlinearity is zero. This is implemented using multiple bias transistors each generating a DC current that is a portion of a DC signal proportional to a selected nonlinearity, a combining circuit that combines the DC currents to form the DC signal, and a feedback circuit to sense the DC signal and generate an input bias voltage of the bias transistors that serves to cancel the selected nonlinearity. However, the method proposed requires multiple FETs and a feedback sense circuit, thus increasing the overall periphery and die size. Additionally, the use of resistors as the feedback bias sense circuit at the source of the transistor degrades the gain and noise figure of the architecture.

U.S. Pat. No. 6,407,640 entitled TWO-STAGE LNA WITH GOOD LINEARITY teaches a two-stage bipolar low noise transistor amplifier architecture with a method for tailoring the inter-stage matching network to provide an optimum third order intercept point (OIP3). A process of simulation and analysis is used to determine the necessary values for the impedance transforming function of the inter-stage matching network. Disadvantages of this circuit include a high component count for the sensing, biasing and buffering circuitry, plus the complex process of simulation and analysis to determine the necessary component values.

U.S. Pat. No. 6,166,599 entitled IMPEDANCE MATCHING NETWORKS FOR NONLINEAR CIRCUITS teaches an active circuit wherein an impedance matching network is configured to cause the third-order intermodulation (IM3) products resulting from the even-order nonlinearity to approximately cancel the IM3 products resulting from the odd-order nonlinearity, and thereby provide a more linear output. However, this architecture requires careful selection of impedance matching networks for simultaneous linearization improvement and good output return loss. Typically, achieving both of these parameters simultaneously is difficult and a trade-off must be made. Additionally, the use of a matching network makes this a narrowband solution.

The technique of current mirror feedback has been successfully demonstrated in Heterojunction Bipolar Transistor (HBT) devices for improved dynamic range. The successful use of current mirror feedback in HBTs is due to the low frequency envelope appearing at the base of the HBT device. It is known that FETs cannot be linearized using this current mirror feedback method as the low frequency envelope appears at the drain of the FET. It would be desirable to have a method of current mirror feedback that improved linearization for FET amplifier circuits at radio frequencies without increasing the noise factor. FET amplifier circuits have several specific advantages over bipolar transistor amplifier circuits. First, biasing of a bipolar transistor must take into account thermal runaway conditions. A typical solution requires the addition of resistors to the base and emitter of the bipolar transistor which degrades the noise figure, gain and output power of the transistor. In contrast, FETs do not require this design consideration.

Second, the mechanism of bipolar transistors requires both electrons and holes as transport carriers, resulting in higher noise figures as compared to FETs, which require only electrons as the transport carrier.

Third, when used with a current mirror, bipolar transistors suffer from the Early effect because of the low current gain of the bipolar transistor. This results in complicated current mirror architectures to boost the current gain. In contrast, FETs have infinite current gain and do not suffer from the Early effect.

Fourth, FETs can be used at low supply voltages and linearity is still maintained at levels down to 1 volt. In contrast, the linearity of a bipolar transistor drops precipitously with decreasing supply voltage.

A higher-performing low-noise FET amplifier with high linearity would provide improved system dynamic range without the expense of increased power consumption, and the associated negative effects of increased power such as cost, size, and thermal management problems. Ideally, a FET amplifier linearization circuit would be realizable in a semiconductor topology with no degradation to other RF parameters including gain, IP3, P1dB, noise figure and return loss.

SUMMARY

The low-noise high linearity FET amplifier of the present invention comprises a first FET amplifying stage with a signal input connected through a first circuit path to the gate of the first amplifying FET, a first biasing circuit electrically connected to the gate of the first amplifying FET, and a first stage signal output. The amplifier further comprises a second amplifying stage including a second amplifying FET, a second stage signal input connected through a second circuit path to the gate of the second amplifying FET, a signal output connected to the second amplifying FET, and a current source FET connected to the second amplifying FET. The amplifier further comprises an interstage matching network connecting the first amplifying stage output and the second amplifying stage input. The amplifier further comprises a second amplifying stage active biasing circuit connected to the gate of the second amplifying FET, wherein the second amplifying stage active biasing circuit has a feedback path whereby the linearity of the low-noise high linearity amplifier is improved by shifting the phase and level of signal intermodulation products.

The low-noise high linearity FET amplifier of the present invention further comprises a current mirror in the first stage active bias circuit, the first amplifying FET and said second amplifying FET being connected in a common source configuration and being each biased at their respective drains by a bias isolation circuit. The second amplifying stage active bias circuit comprises a current source electrically connected to a second stage current mirror FET, and the feedback path which comprises a first feedback resistor, a second feedback resistor, and a feedback capacitor. The first feedback resistor has a first terminal electrically connected to the gate of the second stage current mirror FET and to a first terminal of the feedback capacitor, and a second terminal electrically connected to the drain of the second stage current mirror FET and to a first terminal of the second feedback resistor. The second feedback resistor has a second terminal electrically connected to the gate of the second amplifying FET and to a second terminal of the feedback capacitor. The resistance ratio of the first feedback resistor to the second feedback resistor is approximately equal to the size ratio of the second amplifying FET to the second stage current mirror FET, thereby maintaining a balance in the ratio between the current flowing in the second stage current mirror FET and the second amplifying FET. The selection of the feedback capacitor is dependent upon the size of the second stage current mirror FET, the second amplifying FET, and the frequency of operation. The linearity of the low-noise amplifier is improved by the feedback path of the second amplifying stage active bias circuit shifting the phase and level of signal intermodulation products.

The FETs are all preferably fabricated from a gallium arsenide containing material, an the entire amplifier may be realized in a monolithic microwave integrated circuit.

OBJECTS AND FEATURES OF THE INVENTION

It is an object of the present invention to provide a gallium arsenide FET amplifier circuit with improved linearity.

It is another object of the present invention to provide improved linearity with no degradation to other RF parameters.

It is yet another object of the present invention to provide a circuit which can be realized in a monolithic microwave integrated circuit.

It is a feature of the present invention to employ a common source architecture.

It is another feature of the present invention to use current mirror feedback.

It is yet another feature of the present invention to provide an RC feedback network with the second stage active bias circuit.

BRIEF DESCRIPTION OF THE DRAWINGS

The present version of the invention will be more fully understood with reference to the following Detailed Description in conjunction with the drawings of which.

DESCRIPTION OF THE PREFERRED EMBODIMENTS

Figure 1:
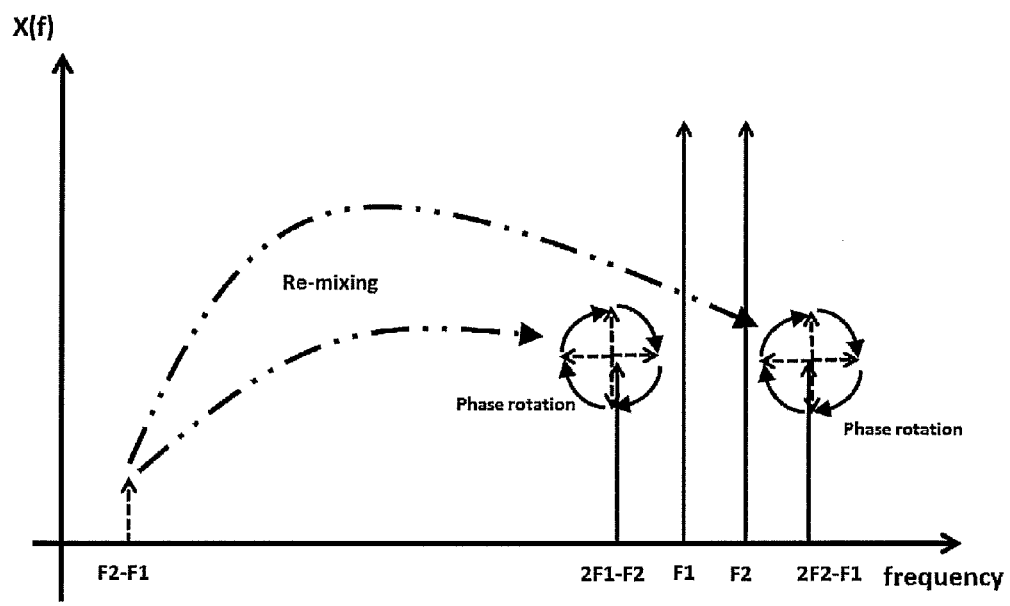
FIG. 1 is a graph of the intermodulation products of a two tone test at frequencies F1 and F2.

FIG. 1 shows a graph of the intermodulation products of a two tone test at frequencies F1 and F2. The OIP3 is used to determine the linearity of an amplifying device. This test consists of providing two excitation signals at frequencies F1 and F2 into an amplifying device. The output of the amplifying device would contain a lot of intermodulation products from the mixing of these two excitation signals. Of particular concern would be the 2F2-F1 and 2F1-F2 intermodulation products as they fall close to the excitation frequencies and are difficult to filter away. Another product of these two input excitation signals is the low frequency envelope, F2-F1. This frequency component can re-mix with the excitation signal F1 and F2 to also form components at the frequency of 2F2-F1 and 2F1-F2, whereby when in-phase with the original intermodulation product, would add to the degradation of the OIP3. Linearity can be improved by properly terminating the difference frequency, F2-F1. However, in the present invention, a circuit is incorporated into the amplifier to phase rotate this product such that the original intermodulation products due to the two input excitation signals will cancel the excitation products due to the re-mixing of the low frequency envelope.

The circuit of the present invention may be simply fabricated as an integrated semiconductor amplifier, making it low cost, small in size and realizable in gallium arsenide (GaAs) semiconductor technology. This current mirror feedback architecture, herein implemented in FETs, results in significant improvements to the linearity of the FET as an amplifier.

Low frequency, low impedance input termination of the envelope frequency is known in the art, but only for single stage bipolar junction transistor (BJT) amplifier circuits. The use of such input termination with FET circuits was previously believed to only work with FETs having a transconductance too low to enable the FET to function efficiently as an amplification device.

Figure 2:
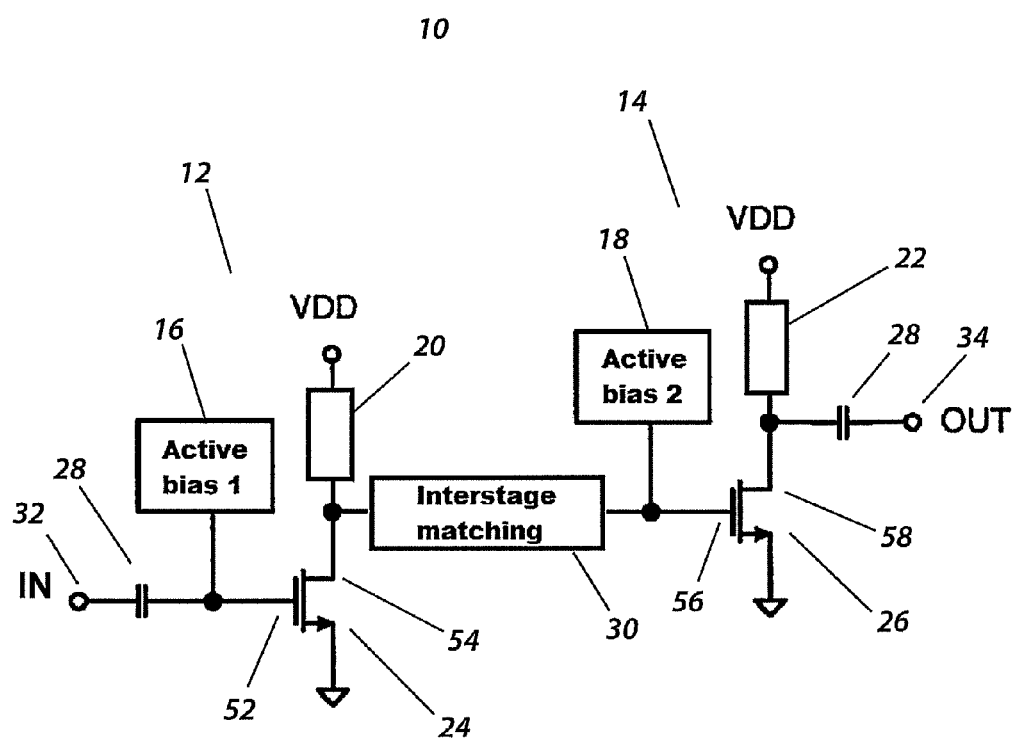
FIG. 2 is the architecture of a two stage low noise FET amplifying circuit.
Figure 3:
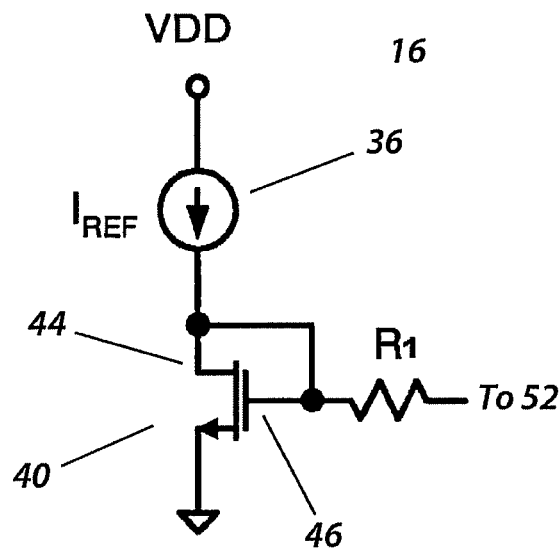
FIG. 3 is the active bias circuit for the first stage of a two stage low noise FET amplifying circuit.
Figure 4:
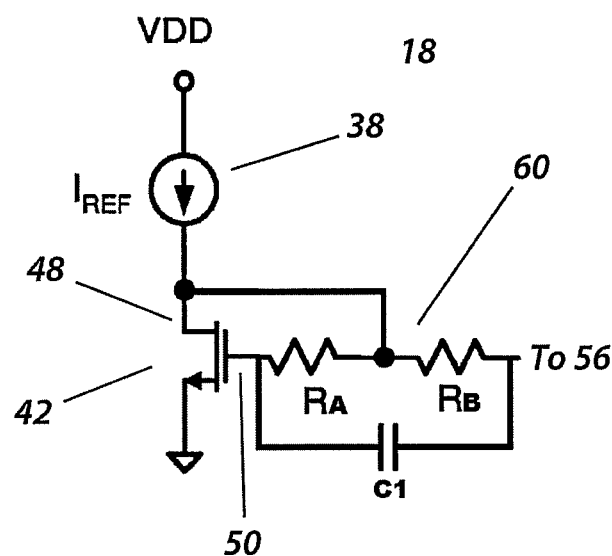
FIG. 4 is the active bias circuit for the second stage of a two stage low noise FET amplifying circuit.

An architecture for a two stage FET amplifying circuit 10 is shown in FIG. 2. The first amplifying stage 12 and second amplifying stage 14 can each consist of any amplifying FET architecture. Examples of suitable amplifying architectures include common source, inductive source degeneration, resistive source degeneration, and cascode amplifying stage. In the preferred embodiment, the first amplifying stage 12 has a first stage FET 24 which is biased at the gate 52 via a first active bias circuit 16 and at the drain 54 via a first bias isolation circuit 20. The second amplifying stage 14 has a second stage FET 26 which is biased at the gate 56 via a second active bias circuit 18 and at the drain 58 via a second bias isolation circuit 22. Each bias isolation circuit may consist of a resistor, inductor, or a combination of resistor and inductor to supply DC power to the FET and to isolate the RF signal from leaking to the bias supply. The bias isolation is typically designed to ensure good stability as well as to decouple noise from the power supply through the use of capacitors to ground. The first active bias circuit 16 and second active bias circuit 18 are illustrated in FIG. 3 and FIG. 4 respectively. An interstage matching network 30 connects the first amplifying stage 12 and second amplifying stage 14. The interstage matching network 30 ranges from a simple coupling capacitor to complex matching networks such as a lossy matching network for controlling the gain slope or for providing better input and output matching. A capacitor 28 is used at both the input 32 and the output 34 to couple the RF signal and block DC currents.

The present invention concerns the design of the second active bias circuit 18 for improving linearity. A key attribute of the present invention is that the first amplifying stage 12, second amplifying stage 14 and interstage network 30 are not adversely affected by the operation of the second active bias circuit 18.

FIG. 3 shows the first active bias circuit 16. The drain 44 and gate 46 of the first current mirror FET 40 are tied together shorting the drain-gate terminal. This allows the first reference current 36 to be dependent on the supply voltage VDD and diode potential of the gate—source of the first current mirror FET 40. The first current mirror FET 40 is tied to the gate 52 of the first amplification FET 24 to mirror the current flowing in the first amplification FET 24. The size ratio between the first current mirror FET 40 and the first amplification FET 24 will determine the amount of current ratio $I_{REF}$ and the current flowing in the first amplification FET 24. Resistor R1 helps to isolate the RF signal from leaking into the current mirror architecture.

FIG. 4 shows the portion of the circuit of the present invention which is used to improve the linearity of a multiple stage FET amplifier. This architecture, if used on a single stage FET amplifying stage, will show no improvement to the linearity. An improvement to linearity is only possible when using this architecture in an amplifier with more than one amplifying FET stage. The construction of the second stage active bias circuit 18 differs from the first stage active bias circuit 16 in that the single resistor R1 is replaced by the linearizing feedback network 60 which is a combination of resistors $R_A$, $R_B$ and feedback capacitor $C_1$. The second reference current 38 flows through the second current mirror FET 42. $R_A$ is placed between the drain 48 and gate 50 of the second current mirror FET 42 while $R_B$ has a similar function to $R_1$ for isolating the RF signal from the current mirror. The capacitor $C_1$ is the feedback path placed between the gates of the second current mirror FET 42 and the second amplification FET 26. The proper selection of component values for $R_A$, $R_B$ and $C_1$ will allow for the control of the phase of the low frequency component F2-F1, and hence improve the OIP3.

Figure 5:
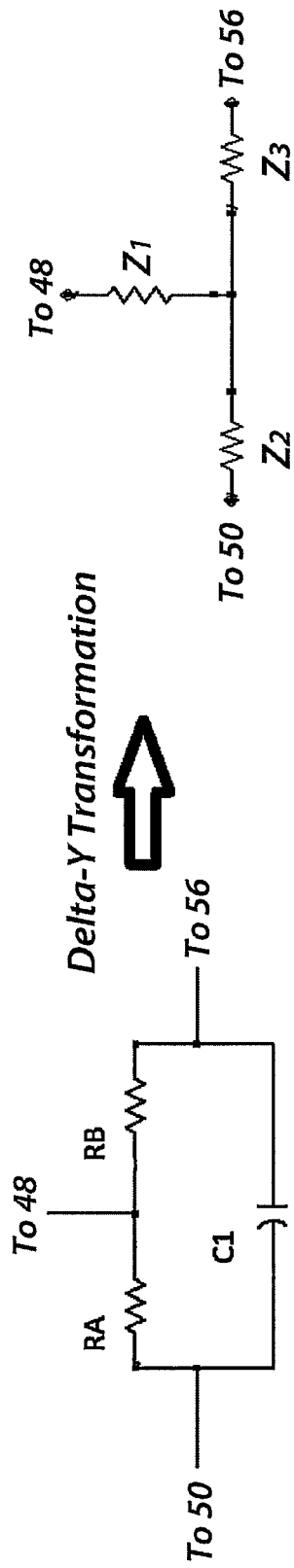
FIG. 5 shows two representations of the RC network used in the second stage active bias circuit.

The linearity improvement circuit as shown in FIG. 4 is analyzed using the Delta-Y transformation as shown in FIG. 5. The equations governing $Z_1$, $Z_2$ and $Z_3$ are:

$$Z_1 = \frac{R_A R_B}{R_A + R_B + \frac{1}{j\omega C_1}}$$

$$Z_2 = \frac{R_A}{1 + j\omega(R_A + R_B)C_1}$$

$$Z_3 = \frac{R_B}{1 + j\omega(R_A + R_B)C_1}$$

At low frequencies (frequencies close F2-F1), $Z_1$ tends to a short, while $Z_2$ and $Z_3$ tend to $R_A$ and $R_B$ respectively. This allows for the selection of resistor values such that the resistance ratio of $R_A$ to $R_B$ should be equal to the size ratio of second amplification FET 26 to second current mirror FET 42. Thus, a balance between the current flowing in the current mirror and the second stage amplifier FET can be maintained.

At higher frequencies $Z_1$ tends to the parallel combination of $R_A$ and $R_B$ while $Z_2$ and $Z_3$ tend to a short with a phase shift close to 90 degrees. This will shift the phase of the intermodulation product 2F2-F1 and 2F1-F2 generated from the re-mixing of the low frequency envelope F2-F1 with the excitation signal F1 and F2. A reduction in the intermodulation products 2F2-F1 and 2F1-F2 can be achieved and hence lower the OIP3. Thus, accurate selection of the capacitor must be made to optimize this phase rotation. The choice of capacitor $C_1$ depends on the size of the second stage amplifier FET 26, second current mirror FET 42 and the frequency of operation. This capacitor is usually selected through optimization routines using simulation tools.

The FET linearization topology of the present invention is easily integrated into a monolithic microwave integrated circuit (MMIC). This novel linearization topology is of benefit to radio frequency communication amplifier, circuit applications including but not limited to wireless cellular, base station and handset, satellite communication, land based, shipborne and airborne, VHF, and UHF radio communications. In addition, the linearization method of the present invention improves linearity without significant negative effects upon RF parameters including gain, IP3, P1dB, noise figure and return loss.

The circuit of the present invention may be simply fabricated as an integrated semiconductor amplifier, making it low cost, small in size and realizable in gallium arsenide (GaAs) semiconductor technology. This current mirror feedback architecture, herein implemented in FETs, results in significant improvements to the linearity of the FET as an amplifier.

Low frequency, low impedance input termination of the envelope frequency is known in the art, but only for single stage bipolar junction transistor (BJT) amplifier circuits. The use of such input termination with FET circuits was previously believed to only work with FETs having a transconductance too low to enable the FET to function efficiently as an amplification device.

Figure 6:
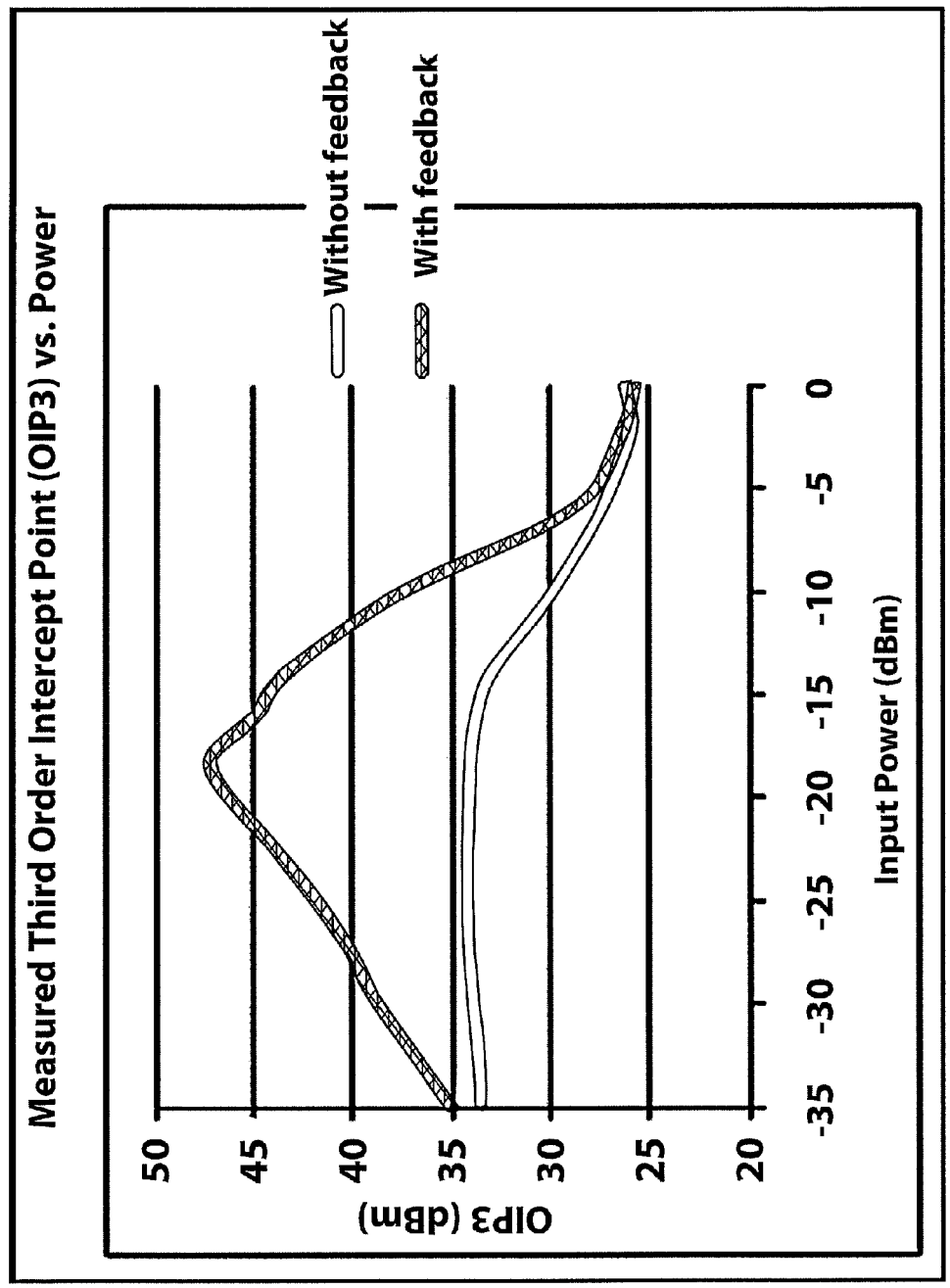
FIG. 6 is a graph of the measured third order intercept point (OIP3) versus input power.

The linearity improvement circuit of the present invention is herein exemplified as a 0.5-2.0 GHz flat gain amplifier. The OIP3 improvement is proven against a similar 0.5-2.0 GHz flat gain amplifier without the feedback element incorporated into the second stage active biasing circuit. FIG. 6 shows the measured OIP3 of the amplifier circuit with and without the active feedback biasing. The architecture of the present invention with the second stage active feedback biasing improves the OIP3 by 12 dBm at −18 dBm input power against the similar 0.5-2.0 GHz flat gain amplifier without the feedback element incorporated into the second stage active biasing circuit.

Figure 7:
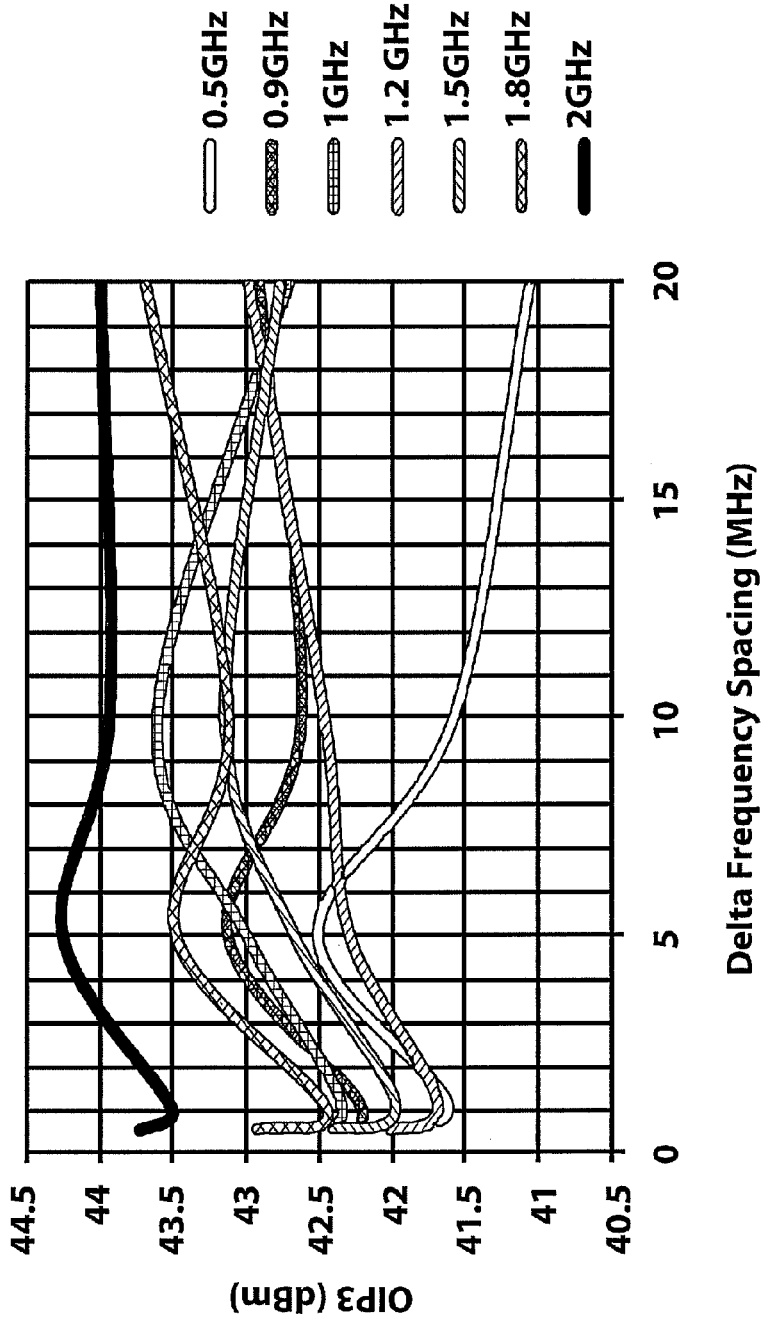
FIG. 7 is a graph of the measured third order intercept point (OIP3) versus delta frequency spacing.

FIG. 7 shows the measured OIP3 at different frequencies with the feedback active biasing on the second stage versus the two tone frequency spacing. The results show the robust nature of the circuit architecture across the two tone spacing frequency.

An alternate embodiment of the present invention has the current mirror implemented with other circuit topologies such as Widlar, Wilson and cascode current mirrors.

Another alternate embodiment of the present invention is implemented in different kinds of amplifier topologies including cascodes, Darlingtons and buffer amplifiers.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A low-noise amplifier with high linearity comprising:
a first amplifying stage comprising a first amplifying FET, a signal input connected through a first circuit path to the gate of said first amplifying FET, a first active bias circuit electrically connected to said gate of said first amplifying FET, and a first stage signal output;
a second amplifying stage comprising a second amplifying FET, a second stage signal input connected through a second circuit path to the gate of said second amplifying FET, and a signal output connected to said second amplifying FET;
an interstage matching network connecting said first stage signal output and said second stage signal input;
a second active bias circuit connected to the gate of said second amplifying FET, said second active bias circuit having a feedback network whereby the linearity of said low-noise amplifier is improved by shifting phase and level of signal intermodulation products;
said second active bias circuit comprises:
a current source; a second stage current mirror FET electrically connected to said current source; and,
said feedback path comprising an RC network, wherein said RC network electrically connects the gate of said second stage current mirror FET with the drain of said second stage current mirror FET, and with said gate of said second amplifying FET;
said RC network further comprises:
a first feedback resistor, a second feedback resistor, and a feedback capacitor;
said first feedback resistor having a first terminal electrically connected to said gate of said second stage current mirror FET and to a first terminal of said feedback capacitor, and a second terminal electrically connected to said drain of said second stage current mirror FET and to a first terminal of said second feedback resistor; and
said second feedback resistor having a second terminal electrically connected to said gate of said second amplifying FET and to a second terminal of said feedback capacitor.

2. The amplifier of claim 1, wherein the resistance ratio of said first feedback resistor to said second feedback resistor is approximately equal to the size ratio of said second amplifying FET to said second stage current mirror FET, thereby maintaining a balance in the ratio between the current flowing in said second stage current mirror FET and said second amplifying FET.

3. The amplifier of claim 2, wherein the selection of said feedback capacitor is dependent upon the size of said second stage current mirror FET, said second amplifying FET, and the frequency of operation.

4. The amplifier of claim 1, wherein said first stage active bias circuit further comprises a current mirror.

5. The amplifier of claim 1, wherein said first amplifying FET and said second amplifying FET are each biased at their respective drains by a bias isolation circuit.

6. The amplifier of claim 1, wherein said first amplifying FET and said second amplifying FET are connected in a common source configuration.

7. The amplifier of claim 1, wherein the FET amplifying architectures are selected from the group consisting of common source, inductive source degeneration, resistive source degeneration, cascode, Darlington and buffer amplifier.

8. The amplifier of claim 1, wherein said second stage current mirror architecture is selected from the group consisting of Widlar, Wilson and cascode current mirrors.

9. The amplifier of claim 1, wherein the FETs are all fabricated from a gallium arsenide containing material.

10. The amplifier of claim 1, wherein said amplifier is realized in a monolithic microwave integrated circuit.

11. A low-noise amplifier with high linearity comprising:
a first amplifying stage comprising
a first amplifying FET, a signal input connected through a first circuit path to the gate of said first amplifying FET, a first active bias circuit electrically connected to said gate of said first amplifying FET, and a first stage signal output;
said first stage active bias circuit further comprising a current mirror;
a second amplifying stage comprising a second amplifying FET, a second stage signal input connected through a second circuit path to the gate of said second amplifying FET, and a signal output connected to said second amplifying FET;
an interstage matching network connecting said first stage output and said second stage input;
said first amplifying FET and said second amplifying FET being connected in a common source configuration;
said first amplifying FET and said second amplifying FET being each biased at their respective drains by a bias isolation circuit;
a second active bias circuit connected to the gate of said second amplifying FET, said second active bias circuit comprising:
a current source;
a second stage current mirror FET electrically connected to said current source;

a feedback network comprising a first feedback resistor, a second feedback resistor, and a feedback capacitor;

said first feedback resistor having a first terminal electrically connected to said gate of said second stage current mirror FET and to a first terminal of said feedback capacitor, and a second terminal electrically connected to said drain of said second stage current mirror FET and to a first terminal of said second feedback resistor;

said second feedback resistor having a second terminal electrically connected to said gate of said second amplifying FET and to a second terminal of said feedback capacitor; and the resistance ratio of said first feedback resistor to said second feedback resistor being approximately equal to the size ratio of said second amplifying FET to said second stage current mirror FET, thereby maintaining a balance in the ratio between the current flowing in said second stage current mirror FET and said second amplifying FET;

wherein the selection of said feedback capacitor is dependent upon the size of said second stage current mirror FET, said second amplifying FET, and the frequency of operation.

12. The amplifier of claim 11, wherein the linearity of said low-noise amplifier is improved by said feedback network of said second active bias circuit shifting phase and level of signal intermodulation products.

* * * * *